United States Patent
Bergkessel et al.

(10) Patent No.: US 6,171,714 B1
(45) Date of Patent: Jan. 9, 2001

(54) ADHESIVELESS FLEXIBLE LAMINATE AND PROCESS FOR MAKING ADHESIVELESS FLEXIBLE LAMINATE

(75) Inventors: Nicholas E. Bergkessel, Mentor; Tad Bergstresser, Shaker Heights; Shiuh-Kao Chiang, Solon; Mary K. Prokop, Cleveland Heights; David B. Russell, Cleveland, all of OH (US)

(73) Assignee: Gould Electronics Inc., Eastlake, OH (US)

( * ) Notice: Under 35 U.S.C. 154(b), the term of this patent shall be extended for 0 days.

(21) Appl. No.: 08/832,097

(22) Filed: Apr. 3, 1997

Related U.S. Application Data

(60) Provisional application No. 60/018,697, filed on May 30, 1996, and provisional application No. 60/015,558, filed on Apr. 18, 1996.

(51) Int. Cl.[7] .................................................. B32B 15/08
(52) U.S. Cl. .................. 428/618; 427/537; 427/404; 427/405; 428/626; 428/636; 428/675
(58) Field of Search .................. 428/615, 618, 428/636, 626, 675; 174/254, 256, 258; 427/536, 537, 404, 405

(56) References Cited

U.S. PATENT DOCUMENTS

| | | | |
|---|---|---|---|
| 3,360,349 | 12/1967 | Adomines | 29/195 |
| 3,981,691 | 9/1976 | Cuneo | 29/195 |

(List continued on next page.)

OTHER PUBLICATIONS

Y.–H. Kim et al; J. Adhesion Sci. Technol. vol. 2, No. 2, (1988), "Adhesion and Interface Investigation of Polyimide on Metals", pp. 95–105.

N. J. Chou et al; J. Vac. Sci. Technol. A2 (2), Apr.–Jun. 1984, "Interfacial Reaction During Metallization of Cured Polyimide: An XPS Study", pp. 751–755.

F. K. LeGoues et al; J. Vac, Sci. Technol. A6 (4), Jul./Aug. 1988, "The Microstructure of Metal–Polyimide Interfaces", pp. 2200–2204.

(List continued on next page.)

*Primary Examiner*—Jenna Davis
(74) *Attorney, Agent, or Firm*—Michael A. Centanni

(57) ABSTRACT

This invention relates to an improved adhesiveless flexible laminate, comprising: a polymer film having a plasma treated surface; a nickel tie coat layer comprising nickel or a nickel alloy adhered to said plasma treated surface; and a copper seed coat layer adhered to the nickel layer. In one embodiment, another layer of copper is adhered to the copper seed coat layer. This invention also relates to a process for making the foregoing adhesiveless flexible laminate, the process comprising the steps of: (A) contacting at least one side of a polymeric film with a plasma comprising ionized oxygen produced from a non-metallizing cathode to provide a plasma treated surface; (B) depositing a tie coat of nickel or nickel alloy on said plasma treated surface; and (C) depositing a seed coat layer of copper on said nickel tie coat layer. The process also includes the optional step of (D) depositing another layer of copper over the copper seed coat layer from step (C).

39 Claims, 2 Drawing Sheets

U.S. PATENT DOCUMENTS

| | | | |
|---|---|---|---|
| 4,152,195 | 5/1979 | Bahrle et al. | 156/656 |
| 4,165,394 | 8/1979 | Ehrbar et al. | 427/40 |
| 4,193,849 | 3/1980 | Sato | 204/38 |
| 4,250,225 | 2/1981 | Shirahata et al. | 428/336 |
| 4,337,279 | 6/1982 | Polak | 427/40 |
| 4,382,101 | 5/1983 | Polak | 427/40 |
| 4,395,313 | 7/1983 | Lindsay et al. | 204/30 |
| 4,604,168 | 8/1986 | Liu et al. | 204/30 |
| 4,720,401 | 1/1988 | Ho et al. | 427/250 |
| 4,765,860 | 8/1988 | Ueno et al. | 156/272.6 |
| 4,863,808 | 9/1989 | Sallo | 428/601 |
| 4,865,711 | 9/1989 | Kittler | 204/192.14 |
| 4,869,930 | 9/1989 | Clarke et al. | 427/252 |
| 4,886,681 | 12/1989 | Clabes et al. | 427/38 |
| 4,931,310 | 6/1990 | Anschel et al. | 427/55 |
| 4,975,327 | 12/1990 | Somasiri et al. | 428/409 |
| 5,108,571 | 4/1992 | Ludwig et al. | 204/192.13 |
| 5,112,462 | 5/1992 | Swisher | 205/165 |
| 5,128,008 | 7/1992 | Chen et al. | 204/192.15 |
| 5,137,791 | 8/1992 | Swisher | 428/612 |
| 5,151,304 | 9/1992 | Lee | 427/250 |
| 5,178,957 | 1/1993 | Kolpe et al. | 428/458 |
| 5,217,589 | 6/1993 | Arledge et al. | 204/192.3 |
| 5,364,707 | 11/1994 | Swisher | 428/612 |
| 5,372,685 | 12/1994 | Anschel | 204/192.14 |
| 5,372,848 | 12/1994 | Blackwell et al. | 427/250 |
| 5,387,495 | 2/1995 | Lee et al. | 430/315 |
| 5,454,920 | 10/1995 | Ishiwata | 204/192.13 |
| 5,461,203 | 10/1995 | Blackwell et al. | 174/260 |
| 5,484,517 | 1/1996 | Hopson, Jr. | 205/88 |
| 5,574,470 | 11/1996 | de Vall | 343/895 |

OTHER PUBLICATIONS

Lj. Atanasoska et al; J. Vac. Sci. Technol. A5 (6), Nov./Dec. 1987, "Aluminum/Polyimide Interface Formation: An X–Ray Photoelectron Spectroscopy Study of Selective Chemical Bonding", pp. 3325–3333.

R. Flitsch et al; J. Vac. Sci. Technol. A8 (3), May/Jun. 1990, "A Study of Modified Polyimide Surfaces As Related to Adhesion", pp. 2376–2381.

T. S. Oh et al; J. Adhesion Sci. Technol vol. 4, No. 2, (1990), "Adhesion Enhancement of Cr/Polyimide Interfaces Using RF Pre–Sputtering of Polyimide Surfaces", pp. 119–129.

J. B. Ma et al; J. Adhesion Sci. Technol. vol. 9, No. 4, (1995) "Use of High Temperature and High Humidity to Test the Adhesion of Sputtered Copper to a Polyimide Surface Modified by an AC Nitrogen Glow Discharge", pp. 487–499.

Majumdar et al; J. Adhesion Sci. Technol. vol. 5, No. 5, (1991) "Investigation of the Locus and Mechanism of Adhesion Failure During Peel Tests on Copper–Chromium Coated Polyimide Systems", pp. 349–363.

F. D. Egitto et al; Plasma Surface Modification of Polymers, "Oxygen Plasma Modification of Polyimide Webs: Effect of Ion Bombardment on Metal Adhesion", pp. 231–253.

N. C. Saha et al; Metallized Plastics 3: Fundamental and Applied Aspects by K.L. Mittal, Plenum Press, New York, 1992, "Oxygen Plasma Treatment of Fluorinated Polyimide: An X–Ray Photoelectron Spectroscopy Study", pp. 215–223.

N. Inagaki et al; Plasma Surface Modification of Polymers, "Improved Adhesion Between Plasma–Treated Polyimide Film and Evaporated Copper", pp. 275–290.

ADHESIVELESS FLEXIBLE LAMINATE AND PROCESS FOR MAKING ADHESIVELESS FLEXIBLE LAMINATE

This application claims benefit of Provisional Application Ser. No. 60/018,697, filed May 30, 1996 and Provisional Application Ser. No. 60/015,558, files Apr. 18, 1996.

TECHNICAL FIELD

This invention relates to adhesiveless flexible laminates and to a process for making the foregoing adhesiveless flexible laminates.

BACKGROUND OF THE INVENTION

Flexible laminates are used in the electronics industry as the base materials for fabricating a wide variety of flexible interconnection products such as flexible circuit boards and flex-rigid circuit boards. Flexible circuit boards and flex-rigid circuit boards are used in notebook computers, printers and hard disc drives, as well as numerous medical devices and consumer products. Flexible laminates are also used for certain advanced applications such as chip-on-flex and fine-line circuit boards. With the electronics industry moving toward thinner, lighter, flexible and more functional products, the demand for flexible laminates continues to increase.

Adhesive based flexible laminates have been used for many of the foregoing applications. However, disadvantages associated with the use of an adhesive layer in the laminate has prohibited such laminates from being accepted for many advanced or high performance flexible circuit applications. Over the years, attempts have been made to eliminate the adhesive layer and to replace it with an adhesiveless product. These include the following approaches (1) cast polyimide on copper foil, (2) high temperature lamination of copper foil with a polyimide substrate and a polyimide adhesive, and (3) direct metallization on a polyimide film followed by electroplating.

Direct metallization has been the most promising of these approaches because of the possibility of metallizing and electroplating on both sides and the advantage of reel-to-reel processing. However, the performance characteristics of laminates made by this technique have not always been completely acceptable. For example, these laminates have usually lacked one or more of the following properties: (1) good initial adhesion, (2) good adhesion after thermal or chemical exposure, (3) an etchable tie coat layer, (4) good dimensional stability, and/or (5) uniform adhesion. Thus, there is a need for improved adhesiveless flexible laminates.

U.S. Pat. No. 4,863,808 discloses a laminate which includes a polyimide film, a layer of metallic chromium vapor deposited on the polyimide, and a layer of copper electrodeposited on the chromium layer.

U.S. Pat. No. 5,112,462 discloses a layered film structure having a metal layer securely bonded to a film layer. The laminate contains a metal-oxide attachment structure between the film and metal layer comprising randomly distributed regions of metal-oxide. The reference indicates that these laminates can be used in the manufacture of flexible printed circuit boards.

U.S. Pat. No. 5,484,517 discloses a method for forming a multi-element, thin hot film sensor on a polyimide film. The sensor is formed by first cleaning one surface of the polyimide using ultrasonic cleaning in a hot solution (i.e., at least 180° F.) of deionized water and biodegradable detergent. Then, under a continuous vacuum, the surface is simultaneously cleaned by ion bombardment using an ion beam gun while nickel is deposited by evaporation. The ion beam cleaning is discontinued and copper is then deposited to an initial thickness of 1000 angstroms by evaporation without a break in the vacuum. The vacuum is then removed and a final thickness of copper is deposited by plating. Sensor patterns are then defined in the nickel and copper layers using conventional photolithography and etching techniques.

SUMMARY OF THE INVENTION

This invention relates to an improved adhesiveless flexible laminate, comprising: a polymer film having a plasma treated surface; a nickel tie coat layer comprising nickel or a nickel alloy adhered to said plasma treated surface; and a copper seed coat layer adhered to the nickel tie coat layer. In one embodiment, another layer of copper is adhered to the copper seed coat layer. This invention also relates to a process for making the foregoing adhesiveless flexible laminate, the process comprising the steps of: (A) contacting at least one side of a polymeric film with a plasma comprising ionized oxygen using a non-metallizing cathode to provide a plasma treated surface; (B) depositing a tie coat layer of nickel or nickel alloy on said plasma treated surface; and (C) depositing a seed coat layer of copper on the nickel tie coat layer. The process also includes the optional step of (D) depositing another layer of copper on the copper seed coat from step (C).

DESCRIPTION OF THE PREFERRED EMBODIMENTS

Figure 1:
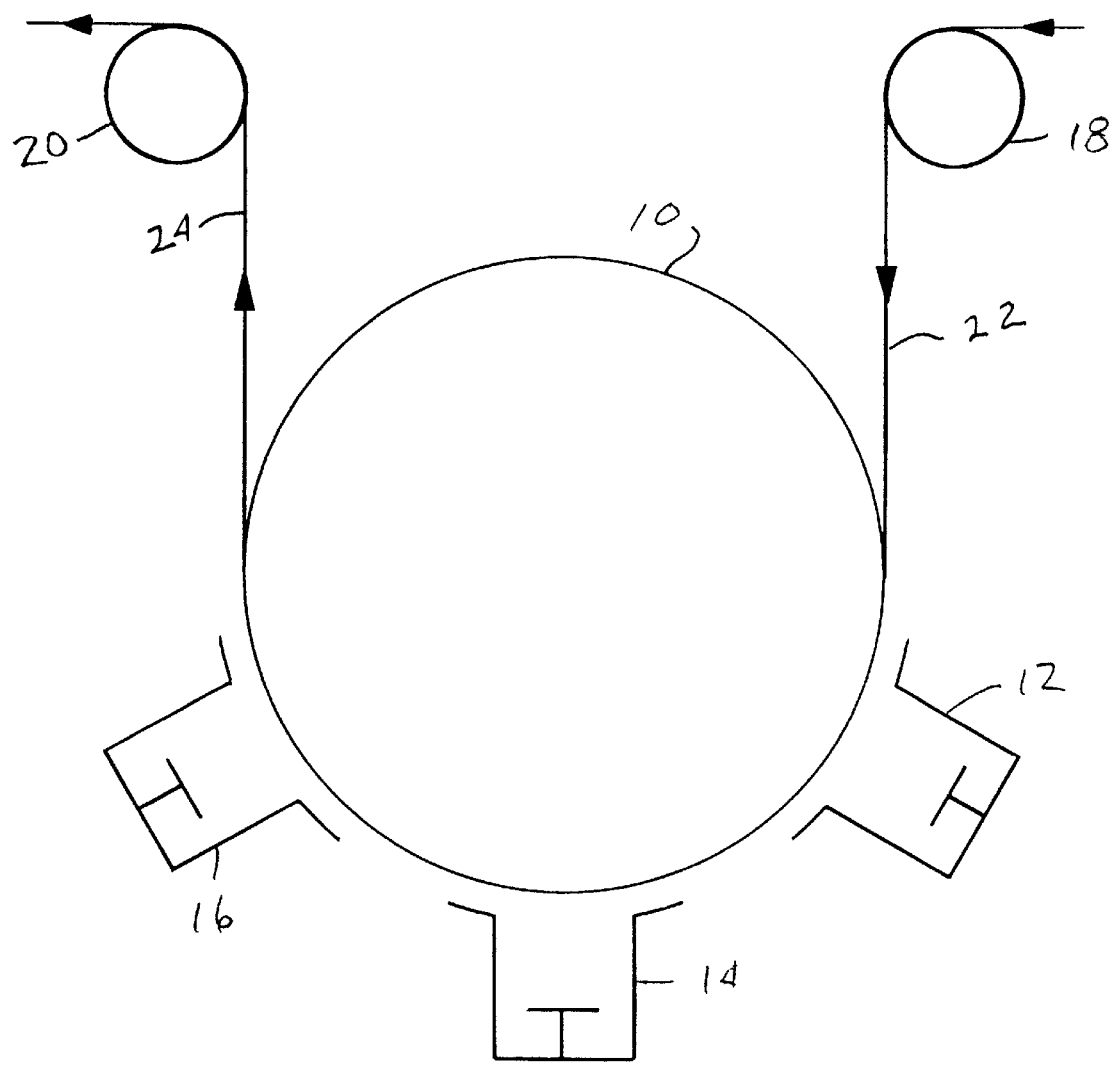
FIG. 1 is a schematic illustration of one embodiment of the inventive process, the process being a continuous process using separate treatment chambers for each of the inventive steps (A), (B) and (C).

The inventive adhesiveless flexible laminate is comprised of a thin, flexible polymeric film. The polymeric film is comprised of at least one thermosetting resin, thermoplastic resin, polyester resin, polyimide resin, condensation polymer, or mixture of two or more thereof. The film has a thickness in the range of up to about 5 mils, and in one embodiment about 0.5 to about 5 mils, and in one embodiment about 0.5 to about 3 mils, and in one embodiment about 0.5 mils, and in one embodiment about 0.8 mils, and in one embodiment about 1 mil, and in one embodiment about 2 mils. The film can be made with or without fillers, woven glass, non-woven glass and/or other fibrous materials. The polymeric film can be a single layered film or a multi-layered film.

The thermosetting resins that can be used to form the polymeric film include phenolic resins, phenol-aldehyde resins, furan resins, amino-plast resins, alkyd resins, allyl resins, epoxy resins, epoxy prepregs, polyurethane resins, thermosetting polyester resins, polyimide bis-maleimide resins, polymaleimide-epoxyresins, polymaleimide-isocyanateresins, siliconeresins, cyanate resins, cyanate-epoxy resins, cyanate-polymaleimide resins, cyanate-epoxy-polymaleimide resins, and the like.

The thermoplastic resins include poly alpha-olefins, polyethylene, polypropylene, poly 4-methyl-pentene-1, ethylene/vinyl copolymers, ethylene vinyl acetate copolymers, ethylene acrylic acid copolymers, ethylene methacrylate copolymers, ethylmethylacrylate copolymers, etc.; thermoplastic propylene polymers such as polypropylene, ethylene-propylene copolymers, etc.; vinyl chloride polymers and copolymers; vinylidene chloride polymers and copolymers; polyvinyl alcohols; acrylic polymers made from acrylic acid, methacrylic acid, methylacrylate, methacrylate, acrylamide, and the like; fluorocarbon resins such as polytetrafluoroethylene, polyvinylidiene fluoride, and fluorinated ethylenepropylene resins; styrene resins such as a polystyrene, alpha-methylstyrene, high impact polystyrene, acrylonitrilebutadiene-styrene polymers, and the like.

The polyester resins include those made from dibasic aliphatic and aromatic carboxylic acids and diols or triols. These include polyethylene terephthalate, polyethylene naphthalate, polybutylene terephthalate, and the like. The polycarbonates, which are long chained linear polyesters derived from carbonic acids (e.g., phosgene) and dihydric phenols (e.g., bisphenol A), can be used.

The polyimide resins are particularly useful. These can be made by a reaction involving contacting a tetrabasic acid dianhydride with an aromatic diamine giving first a polyamic acid which is then converted by heat or catalyst into a high molecular weight linear polyimide.

The condensation polymers that are useful include the polyamides, polyetherimides, polysulfones, polyethersulfones, polybenzazoles, aromatic polysulfones, polyphenylene oxides, polyether ether ketones, and the like.

The film materials that are particularly useful are the polyester film materials such as polyethylene terephthalate and polybutylene terephthalate, and the polyimides. These film materials are sold by DuPont, Allied-Apical, Teijin, Kanega-fuchi and Ube Industries, under the tradenames Mylar®, Kapton®, Apical® and Upilex®.

The polymeric film has at least one side that is plasma treated. The plasma used to treat the film surface is comprised of ionized oxygen that is produced using a non-metallizing cathode. The plasma is applied to the film surface for an effective period of time and at a sufficient level of intensity to chemically modify the surface, remove surface contaminates and/or enhance surface roughness.

The plasma-treated surface has a nickel tie coat layer adhered to it.

The nickel tie coat layer is comprised of nickel or a nickel-based alloy. The alloying metal is selected from the group consisting of Cu, Cr, Fe, V, Ti, Al, Si, Pd, Ta, W, Zn, In, Sn, Mn, Co and mixtures of two or more thereof. Preferred alloying metals include Cu, Fe, V, Ti and Cr. The nickel tie coat layer has a thickness in the range of about 30 to about 500 angstroms, and in one embodiment about 50 to about 300 angstroms. In one embodiment, the nickel tie coat layer is a continuous layer.

The nickel tie coat layer has a copper seed coat layer adhered to it. The copper seed coat layer has a thickness of about 200 to about 20000 angstroms, and in one embodiment from about 1200 to about 5000 angstroms, and in one embodiment about 1200 to about 3000 angstroms, and in one embodiment about 1500 to about 2500 angstroms.

An optional layer of copper can be adhered to the copper seed coat layer. The thickness of this optional copper layer can be up to about 70 $\mu$m, and in one embodiment it is in the range of about 2 to about 60 $\mu$m, and in one embodiment about 5 to about 40 $\mu$m. In one embodiment, this copper layer has a thickness of about 5 $\mu$m, and in one embodiment about 10 $\mu$m, and in one embodiment about 15 $\mu$m, and in one embodiment about 18 $\mu$m, and in one embodiment the thickness is about 35 $\mu$m.

The inventive laminate structural layers comprised of the plasma treated surface, nickel tie coat layer, copper seed coat layer and optional additional copper layer can be adhered to one side of the polymeric film or to both sides of the film. If only one side of the polymeric film is treated in accordance with the invention, the other side can be untreated or it can have an adhesive layer and/or a layer of metal foil adhered to it. Examples of the adhesives that can be used include epoxies, polyimides and acrylics. These can be used alone or in combination with phenolics or polyvinylbutyral resins. Examples of the metal foils that can be used include copper foil. The adhesive layer and/or metal foil layer can be adhered to the polymeric film using conventional techniques. For example, the metal foil can be adhered to the polymeric film using an adhesive. The adhesive layer and/or metal foil layer can be adhered to the polymeric film subsequent to the adherence of the inventive laminate structural layers.

Steps (A), (B) and (C) of the inventive process can be carried out in a continuous manner using a single chamber which is divided into sections that are operated at pressures that are optimized for each step. The process steps can also be carried out in a continuous manner using separate chambers for each process step (A), (B) and (C). The process steps (A), (B) and (C) can also be carried out in a stepwise continuous manner using a single chamber and multiple passes through the chamber to provide for each of the processing steps. An advantage of the inventive process is that the vacuum can be broken between any of the process steps.

The plasma that is used to treat the polymeric film during step (A) of the inventive process is generated using a non-metallizing cathode. The term "non-metallizing cathode" refers to cathodes that do not deposit significant levels of metal or metal oxide on the surface of the polymeric film during step (A) of the inventive process. The term "significant levels" refers to levels of no more than about 0.1 atomic percent as measured by x-ray photoelectron spectroscopy. The non-metallizing cathodes include non-metallic cathodes such as carbon cathodes. In one embodiment, certain metal cathodes such as cathodes constructed of Al, Ti, V, and mixtures of two or more thereof can be used. Carbon cathodes are preferred. Direct current or alternating current can be used, with direct current being preferred. The plasma gas can be oxygen, air or gaseous mixtures containing oxygen at a concentration of up to about 100%, and in one embodiment about 15% to about 100%, and one or more second gases (e.g., $N_2$, Ar, Kr, $NH_3$, $N_2O$, $CF_4$, $CO_2$ or one or more noble gases). In one embodiment, the plasma gas is oxygen or air. The pressure in the plasma chamber is typically in the range of about 10 to about 500 mTorr, and in one embodiment about 20 mTorr to about 200 mTorr, and in one embodiment about 30 mTorr to about 150 mTorr, and in one embodiment about 40 to about 100 mTorr. The discharge power density is in the range of about 0.1 to about 8 W/cm$^2$, and in one embodiment about 0.17 to about 6.2 W/cm$^2$, and in one embodiment about 0.34 to about 2.41 W/cm$^2$. The total energy input into the surface is in the range of about 0.02 to about 150 J/cm$^2$, and in one embodiment about 0.05 to about 113 J/cm$^2$, and in one embodiment about 0.4 to about 11.3 J/cm$^2$. The polymeric film can be subjected to one or more than one plasma treatment steps during the inventive process.

The deposition steps (B) and (C) can be performed using any of the vapor deposition techniques well known to those skilled in the techniques include physical vapor deposition (PVD), which includes sputtering, thermal evaporation, electron beam deposition, inductive deposition, resistive deposition, ion plating, plasma-activated evaporation, reactive evaporation or activated reactive evaporation; and chemical vapor deposition (CVD). Physical vapor deposition also has been referred to in the literature as vacuum metallization or evaporative coating. In thermal evaporation deposition procedures, the metallic material to be deposited is heated in a high vacuum (e.g., a base pressure of less than about 1 mTorr, and in one embodiment a base pressure of about 0.001 mTorr) whereupon the metallic material evaporates or sublimates and travels to the substrate. Physical vapor deposition essentially involves the transfer of the material to be deposited by physical means alone in contrast to chemical vapor deposition in which the material transfer is effected by chemical reactions induced by temperature or concentration gradients between the material to be deposited and the surrounding gaseous atmosphere. The principles of vapor deposition and procedures useful in vapor depositing various materials including metals is described in *Vapor Deposition*, edited by C. F. Powell et al, John Wiley & Sons, Inc., New York, 1966, which is incorporated herein by reference for its description of PVD processes.

Chemical vapor deposition usually is accomplished by vaporizing a metallic halide and decomposing or reacting the vapors at the substrate surface to yield the non-volatile metal on the surface of the substrate as a coating. The chemical reactions of vapor deposition can be effected by thermal deposition or pyrolysis, hydrogen reduction, reduction with metal vapors, reaction with the substrate, chemical transport reactions, etc. These procedures are described in detail in Chapter 9 of *Vapor Deposition*, C. F. Powell, J. H. Oxley, and J. M. Blocker, Jr., editors, J. Wiley & Sons, Inc., New York, 1966, and this chapter is incorporated by reference for its description of the CVD processes.

Sputtering is a useful vapor deposition technique for both steps (B) and (C) of the inventive process. This technique involves a material transport phenomenon caused by energetic atoms or ions striking a cathode target, causing the material making up the cathode target to be transferred to a vapor state through a momentum transfer mechanism, and subsequently to a different surface. The substrate to be coated is placed adjacent to a cathode. The cathode target is made of the substance which forms the coating. Thus, during step (B) the cathode target is made of nickel or a nickel alloy, and the substrate to be coated is the plasma treated film. During step (C) the cathode target is made of copper, and the substrate to be coated is the nickel-coated, plasma-treated film. The cathode is subjected to a high negative voltage and is placed in an inert gas atmosphere at low pressure. Under the influence of the high voltage, atmospheric ions are accelerated against the surface of the cathode target wherein the momentum of the ions is transferred to atoms on the surface of the cathode target, ejecting the atoms from the surface of the cathode target and causing them to contact and adhere to the adjacent substrate. The inert gases that are useful for both steps (B) and (C) include helium, neon, argon, krypton, xenon, and the like.

During step (B) the metal to be deposited is Ni or a Ni based alloy. Useful alloying metals include Cu, Cr, Fe, V, Ti, Al, Si, Pd, Ta, W, Z, In, Sn, Mn, Co, and combinations of two or more thereof. Preferred alloying metals include Cu, Fe, Cr and V. Commercially available Ni alloys that are particularly useful include Monel (about 67% Ni, 30% Cu), Inconel about (76% Ni, 16% Cr, 8% Fe), Nickel "A" (about 99.4% Ni+Co), Nickel "D" (about 95% Ni, 4.5% Mn), Duranickel (about 94% Ni, 4.5% Al), Cast Nickel (about 97% Ni, 1.5% Si), "K" Monel (about 66% Ni, 29% Cu, 3% Al), Monel (cast) (about 63% Ni, 30% Cu, 1.5% Si), "H" Monel (cast) (about 63% Ni, 30% Cu, 3% Si), "S" Monel (cast) (about 63% Ni, 30% Cu, 4% Si), Inconel (cast) (about 72% Ni, 16% Cr, 8% Fe, 2% Si), Ni-o-nel (about 42% Ni, 30% Fe, 22% Cr, 3% Mo, 2% Cu, 1% Ti), Hastelloy Alloy B (about 62% Ni, 28% Mo, 5% Fe), Hastelloy Alloy C (about 54% Ni, 17% Mo, 15% Cr, 5% Fe, 4% W), Hastelloy Alloy D (about 85% Ni, 10% Si, 3% Cu), Hastelloy Alloy F (about 47% Ni, 22% Cr, 7% Mo, 17% Fe), Hastelloy Alloy N (about 70% Ni, 17% Mo, 7% Cr, 5% Fe), Hastelloy Alloy W (about 62% Ni, 24.5% Mo, 5% Cr, 5.5% Fe), Hastelloy Alloy X (about 47% Ni, 22% Cr, 9% Mo, 18% Fe), Illium B (about 50% Ni, 28% Cr, 8.5% Mo, 5.5% Cu), Illium G (about 56% Ni, 22.5% Cr, 6.5% Mo, 6.5% Cu), Illium R (about 68% Ni, 21% Cr, 5% Mo, 3% Cu), Illium 98 (about 55% Ni, 28% Cr, 8.5% Mo, 5.5% Cu), (about 80% Ni, 20% Cr), (about 60% Ni, 24% Fe, 16% Cr), (about 35% Ni, 45% Fe, 20% Cr), (about 45% Ni, 55% Cu), and the like. The pressure is in the range of about 1.5 to about 15 mTorr, and in one embodiment about 2.5 to about 10 mTorr. The thickness of the tie coat that is deposited during step (B) is from about 30 to about 500 angstroms, and in one embodiment from about 50 to about 300 angstroms.

During step (C) the metal to be deposited is copper. The pressure is in the range of about 1.5 to about 15 mTorr, and in one embodiment about 2.5 to about 10 mTorr. The thickness of the copper seed coat layer that is deposited during step (C) is from about 200 to about 20000 angstroms, and in one embodiment about 1200 to about 5000 angstroms, and in one embodiment from about 1200 to about 3000 angstroms, and in one embodiment about 1500 to about 2500 angstroms.

The laminate prepared in accordance with steps (A), (B) and (C) of the inventive process is a useful product in itself, and is also particularly suited for treatment in accordance with step (D) of the inventive process. Step (D) involves the subsequent deposition of another layer of copper over the seed coat copper layer deposited during step (C). The copper layer deposited during step (D) can be formed using a variety of known techniques, including electroplating, electroless plating and vapor deposition. The copper layer deposited during step (D) typically has a thickness in the range of up to about 70 $\mu$m, and in one embodiment in the range of about 2 to about 60 $\mu$m, and in one embodiment about 5 to about 40 $\mu$m. In one embodiment, this copper layer has a thickness of about 5 $\mu$m, and in one embodiment about 10 $\mu$m, and in one embodiment about 15 $\mu$m, and in one embodiment about 18 $\mu$m, and in one embodiment the thickness is about 35 $\mu$m.

Electroplating is the electrodeposition of metallic coating on an electrode surface to form a metal deposit. The electrode surface being treated is made the cathode in an electroplating solution or bath. Such baths are typically aqueous solutions from which metal is reduced by the flow of an electric current through a solution of the metal salt. In performing electroplating of metal on a conductive electrode, the electrode or substrate is often cleaned, rinsed, dipped in acid or is subject to other pretreatment or substrate preparation. In operating an electroplating process, the substrate is immersed into a solution and necessary electric current is applied typically from metallic anodes to the substrate cathode. The solutions are often agitated and the temperature, electric current, metal concentration and other variables are closely controlled using well known principles.

Copper layers can also be formed using electroless plating, which is a controlled autocatalytic deposition of a continuous film by the interaction, in a solution of metal salt, between a metal and a chemical reducing agent. Electroless deposition can give films of metals, alloys, metallic compounds, and composites on both conductive and non-conductive surfaces. Electroless solutions contain a metal salt, a reducing agent, a pH adjuster or buffer, a complexing agent and one or more additives to control solution stability, film properties, deposition rates, etc. The advantage of electroless plating is the ability to plate metal on non-conductive or poorly conductive surfaces.

The vapor deposition techniques, both PVD and CVD, discussed above with respect to steps (B) and (C) are also applicable to step (D) of the inventive process except that the copper layer deposited during step (D) has a thickness of up to about 70 $\mu$m as discussed above.

Once the copper layer made during step (D) of the inventive process is formed, a printed wiring board can be made by forming the circuit pattern. The pattern can be formed by an etching process wherein a resist and etchant baths are used to selectively remove copper leaving the pattern. These techniques are well known in the art.

Referring now to the illustrated embodiment disclosed in FIG. 1, the inventive process is conducted in a continuous manner using separate treatment chambers for each of the inventive steps. The apparatus includes a drum 10, plasma treatment chamber 12, sputter chambers 14 and 16, and idlers 18 and 20, which are positioned in a vacuum chamber (not shown). The polymeric film material 22 to be treated is advanced from a take off reel (not shown) to and over idler 18 onto drum 10 which turns in clockwise direction. The film 22 passes through chambers 12, 14 and 16 wherein it is treated in accordance with inventive steps (A) (B) and (C), and then treated film 24 advances over idler 20 to a take-up reel (not shown). The operating conditions within chambers 12, 14 and 16 are as indicated above for performing steps (A), (B) and (C) of the inventive process, respectively.

Figure 2:
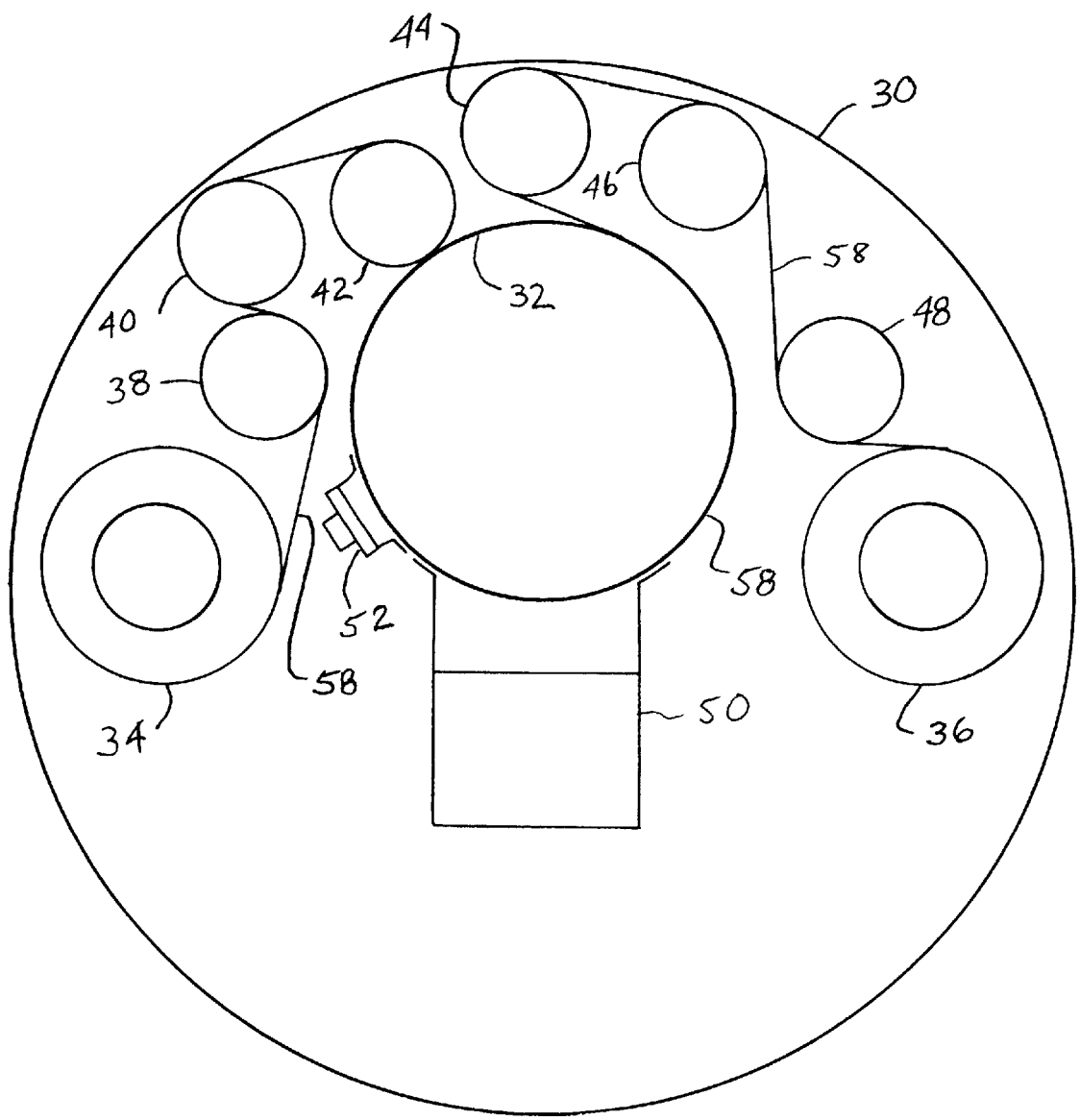
FIG. 2 is a schematic illustration of another embodiment of the inventive process, the process being a discontinuous process using a single vacuum chamber for performing the inventive steps (A), (B) and (C).

Referring to FIG. 2, the apparatus employed in this embodiment includes vacuum chamber 30, rotatable drum 32, reels 34 and 36, guide rollers 38, 40, 42, 44, 46 and 48, sputtering cathode 50 and plasma treatment cathode 52. The vacuum chamber 30 is in the form of a cylinder and is constructed so as to be able to withstand very low pressures (e.g., base pressures as low as about $10^{-6}$ mTorr are typically used with inventive process). In one embodiment, a mechanical pump and a diffusion pump are used to achieve the desired pumpdown. The drum 32 can be rotated at any desired speed and, in one embodiment, it is adapted for operation in the range of about 0.1–200 feet per minute. The temperature of drum 32 is controlled using a temperature control mechanism (not shown). The desired drum temperature is dependent upon the equipment used, the deposition rate and the linespeed. Typically, the drum temperature is maintained in the range of about $-30°$ C. to about $200°$ C., and in one embodiment about $0°$ C. to about $100°$ C. The optimum drum temperature can be readily determined by one skilled in the art. The sputtering cathode 50 and plasma treatment cathode 52 are enclosed within their own separate shield structures or sub-chambers, and when used the shield structures extend to points very nearly touching the drum 32 (or polymeric film 58 wrapped around the drum 32).

In operation, the vacuum chamber is pumped down to a base pressure which is typically in the range of about $10^{-6}$ mTorr to about 475 mTorr, and in one embodiment about $10^{-6}$ mTorr to about 250 mTorr, and in one embodiment about $10^{-5}$ mTorr to about 100 mTorr, and in one embodiment about $10^{-4}$ mTorr to about 1 mTorr, and in one embodiment about $10^{-4}$ mTorr to about 0.1 mTorr, and in one embodiment about 0.01 mTorr. Step (A) of the inventive process is conducted by flowing the plasma gas into the sub-chamber for the plasma treatment cathode 52. The polymeric film material 58 to be treated is advanced from reel 34, over guide rollers 38, 40 and 42, around rotating drum 32 past plasma treatment cathode 52, and then over guide rollers 44, 46 and 48 to reel 36 where it is wound. The plasma treatment step (A) is conducted using plasma treatment cathode 52 under the conditions indicated above with the result being that the polymeric film 58 that is wound on reel 36 is a plasma-treated polymeric film. During step (B), the plasma-treated polymeric film is advanced in the opposite direction from reel 36 over guide rollers 48, 46 and 44, around drum 32 past sputtering cathode 50, and then over guide rollers 42, 40 and 38 to reel 34. The target on the sputtering cathode 50 is a nickel or nickel alloy target. The inert gas flows into the sub-chamber of the sputtering cathode 50 and the sputtering cathode is used to apply the nickel or nickel alloy tie coat to the plasma-treated surface of polymeric film 58 as the plasma treated film 58 passes sputtering cathode 50. Then the nickel or nickel alloy target on the sputtering cathode 50 is changed to a copper target. During step (C), the polymeric film 58 which has been plasma treated and has a nickel or nickel alloy tie coat applied to the plasma treated surface, is advanced from reel 34, over guide rollers 38, 40 and 42, around drum 32 past sputtering cathode 50, and then over guide rollers 44, 46 and 48 to reel 36 where it is wound. The sputtering cathode 50 is operated under the conditions indicated above to apply the copper seed coat over the nickel or nickel alloy tie coat as the film 58 passes the sputtering cathode 50.

In order to further describe the invention, the following examples are provided.

EXAMPLE 1

A polyimide film is loaded in an apparatus of the type depicted in FIG. 2. The polyimide film is Upilex-S (a product of Ube Industries identified as a polyimide film) having a thickness of 1 mil. The pressure in the vacuum chamber is reduced to 0.01 mTorr. The following sequential process steps are followed: (A) a side of the film is plasma treated using ionized oxygen; (B) a nickel alloy is sputtered on the plasma treated surface to form a nickel tie coat layer; and (C) a seed coat layer of copper is sputtered on the nickel tie coat. During step (A) the plasma is generated using direct current, oxygen and a carbon bar as the cathode. The pressure is 60 mTorr, the discharge power density is 0.72 W/cm$^2$, and the total energy input is 1.7 J/cm$^2$. During steps (B) and (C) the cathode is a direct current magnetron sputtering cathode. During step (B) the nickel alloy is Monel, the pressure is 3.5 mTorr, and the inert gas is argon. The nickel alloy tie coat has a thickness of 140 angstroms. During step (C), the pressure is 3.5 mTorr and the inert gas is argon. The sputtered seed coat layer of copper has a thickness of 2000 angstroms. Then a layer of copper having a thickness of 35 $\mu$m is electroplated on the seed coat layer of copper. The resulting laminate has a standard 90° peel strength of 5.5 pounds per inch of width using Test Method 2.4.9 of IPC-TM-650, Method B.

EXAMPLE 2

The process of Example 1 is repeated except that during step (B) the nickel alloy is Inconel. The pressure is 3.5 mTorr argon. The nickel alloy tie coat has a thickness of 169 angstroms. The resulting laminate has a standard 90° peel strength of 5.7 pounds per inch of width.

EXAMPLE 3

The process of Example 1 is repeated except that during step (D) a copper layer having a thickness of 18 µm is electroplated on to the sputtered copper seed coat layer. Samples of the resulting laminate are subjected to chemical exposure and tested for adhesion using test method IPC-TM650, Method 2.3.2, Method A, at room temperature with the results being as follows:

| Sample | Chemical* | Peel Strength** (lb/in) | Chemical*** Resistance (%) |
|---|---|---|---|
| 1 | None | 3.0 | |
| 2 | Isopropyl Alcohol | 3.0 | 100 |
| 3 | Toluene | 3.0 | 100 |
| 4 | Methyethyl ketone | 3.0 | 100 |
| 5 | Chlorinated Solvent | 3.0 | 91 |
| 6 | 2N HCl | 3.0 | 91 |
| 7 | 2N NaOH | 2.7 | 90 |
| 8 | 1) Methylene Chloride**** 2) 2N NaOH 3) 2N $H_2SO_4$ | 2.7 | 90 |

*Sample immersed for 1 minute at room temperature.
**Peel strength is 90° peel strength measured in pounds per inch of sample width using Test Method 2.4.9 of IPC-TM-650, Method B.
***Chemical resistance is measured using Test Method 2.3.2 of IPC-TM-650.
****Sample No. 8 involves a sequential immersion in each of the indicated chemicals for 1 minute each.

EXAMPLE 4

The process of Example 1 is repeated except that the thickness of the sputtered copper layer are varied as indicated below. The peel strength for each sample is also indicated below.

| Sample | Thickness (Angstrom) | Peel Strength (lb/in) |
|---|---|---|
| 1 | 2000 | 6.6 |
| 2 | 2000 | 6.5 |
| 3 | 2000 | 6.2 |
| 4 | 2000 | 6.7 |
| 5 | 2000 | 6.5 |
| 6 | 2000 | 6.9 |
| 7 | 1500 | 6.5 |
| 8 | 2500 | 6.5 |

EXAMPLE 5

The process of Example 1 is repeated except that the polyimide film material is Kapton-E (a product of DuPont identified as a polyimide film) having a thickness of 2 mils. During step (A) the power density and energy density are varied as indicated below. The peel strength for each sample is also indicated below.

| Sample | Power Density (W/cm$^2$) | Energy Density (J/cm$^2$) | Peel Strength (lb/in) |
|---|---|---|---|
| 1 | 0.73 | 3.42 | 7.9 |
| 2 | 0.73 | 1.28 | 8.5 |
| 3 | 0.73 | 1.71 | 8.0 |
| 4 | 0.73 | 1.71 | 7.9 |
| 5 | 0.94 | 2.20 | 8.1 |
| 6 | 1.09 | 2.55 | 9.0 |
| 7 | 1.23 | 2.88 | 8.4 |
| 8 | 1.47 | 3.44 | 9.6 |

EXAMPLE 6

The process of Example 1 is repeated except that with some samples, as indicated below, the polyimide film material is Upilex-S with a thickness of 1 mil. Also, during step (A) the power density is 0.73 W/cm$^2$. For each sample the Monel tie coat has a thickness of 140 angstroms and the sputtered copper layer has a thickness of 2000 angstroms. The copper layer that is electroplated during step (D) has a thickness of 18 µm or 35 µm as indicated below. The initial peel strength, peel strength after solder float, and peel strength after thermal cycling are indicated below.

| Sample | Film | Electroplate Thickness (µm) | Initial Peel (lb/in) | Peel After* Solder Float (lb/in) | Peel After** Thermal Cycling (lb/in) |
|---|---|---|---|---|---|
| 1 | Upilex-S | 18 | 4.3 | 4.5 | 4.4 |
| 2 | Upilex-S | 18 | 4.1 | 4.0 | 3.8 |
| 3 | Upilex-S | 35 | 6.3 | 3.7 | 5.2 |

*Peel after solder float is performed using Test Method 2.4.9 of IPC-TM-650, Method D.
**Peel after thermal cycling is performed using Test Method 2.4.9 of IPC-TM-650, Method F.

EXAMPLE 7

The process of Example 1 is repeated except that the polyimide film material is Kapton-E (a product of DuPont identified as a polyimide film) having a thickness of 2 mils. Also, during step (A) the power density is 0.73 W/cm$^2$ and the energy density is 1.71 J/cm$^2$. The initial peel strength of the resulting laminate is 8.3 lb/in as measured using Test Method 2.4.9 of IPC-TM-650, Method A, and 7.6 lb/in as measured using Test Method 2.4.9 of IPC-TM-650, Method B. The peel strength after solder float is 6.8 lb/in as measured using Test Method 2.4.9 of IPC-TM-650, Method D. The peel strength after thermal cycling is 6.8 lb/in as measured using Test Method 2.4.9 of IPC-TM-650, Method F. The samples of the resulting laminate are subjected to chemical exposure and tested for adhesion in accordance with test method IPC-TM-650, Method 2.3.2, Method A, with the results being as follows:

| Sample | Chemical* | Peel Strength** (lb/in) | Chemical*** Resistance (%) |
|---|---|---|---|
| 1 | None | 8.7 | — |
| 2 | Isopropyl Alcohol | 8.7 | 100 |
| 3 | Toluene | 8.7 | 100 |
| 4 | Methy Ethyl Ketone | 8.7 | 100 |
| 5 | Chlorinated Solvent | 8.3 | 95 |
| 6 | 2N HCl | 8.3 | 95 |

-continued

| Sample | Chemical* | Peel Strength** (lb/in) | Chemical*** Resistance (%) |
|---|---|---|---|
| 7 | 2N NaOH | 8.3 | 95 |
| 8 | 1) Methylene Chloride****<br>2) 2N NaOH<br>3) 2N H$_2$SO$_4$ | 8.0 | 92 |

*Sample immersed for 1 minute at room temperature.
**Peel strength is 90° peel strength measured in pounds per inch of sample width using Test Method 2.4.9 of IPC-TM-650, Method B.
***Chemical resistance is measured using Test Method 2.3.2 of IPC-TM-650.
****Sample No. 8 involves a sequential immersion in each of the indicated chemicals for 1 minute each.

The samples of the resulting laminate are tested for dimensional stability in accordance with Test Method 2.2.4 of IPC-TM-650, Methods B and C. The absolute value of the dimensional change is less than or equal to 0.04% using Method B and the absolute value of the dimensional change is less than or equal to 0.03% using Method C.

The inventive flexible laminates have a number of advantages over the prior art. These include good initial adhesion, good adhesion after thermal or chemical exposure, etchable tie coat layers, good dimensional stability, and uniform adhesion. Also, the inventive process is advantageous due to the fact that it can be performed on a continuous basis or a step wise continuous basis and that the vacuum can be broken between each of the steps in the process. The inventive process also provides the possibility of plating on both sides of the film and reel-to-reel processing.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

We claim:

1. An adhesiveless flexible laminate, comprising:
   a polymeric film having a plasma treated surface, the plasma used for treating said polymeric film comprising ionized oxygen generated by a non-metallic cathode;
   a nickel tie coat layer comprising nickel or a nickel alloy adhered to said plasma treated surface; and
   a copper seed coat layer adhered to said nickel layer.

2. The laminate of claim 1 with another layer of copper adhered to said copper seed coat layer.

3. The laminate of claim 1 wherein one side of said polymeric film has said plasma treated surface and said metal tie coat layer and said copper seed coat layer adhered to it.

4. The laminate of claim 1 wherein each side of said polymeric film has said plasma treated surface and said nickel tie coat layer and said copper seed coat layer adhered to it.

5. The laminate of claim 1 wherein said polymeric film comprises at least one thermosetting resin, thermoplastic resin, polyester resin, polyimide resin, condensation polymer, or mixture of two or more thereof.

6. The laminate of claim 1 wherein said polymeric film comprises at least one polyimide resin.

7. The laminate of claim 1 wherein said polymeric film is flexible and has a thickness in the range of up to about 5 mils.

8. The laminate of claim 1 wherein the alloying metal for said nickel alloy is selected from the group consisting of Cu, Cr, Fe, V, Ti, Al, Si, Pd, Ta, W, Zn, In, Sn, Mn, Co, and mixtures of two or more thereof.

9. The laminate of claim 1 wherein said nickel tie coat layer has a thickness in the range of about 30 to 500 angstroms.

10. The laminate of claim 1 wherein said nickel tie coat layer is a continuous layer.

11. The laminate of claim 1 wherein said copper seed coat has a thickness in the range of about 200 to about 20000 angstroms.

12. The laminate of claim 2 wherein said another layer of copper has a thickness of up to about 70 microns.

13. The laminate of claim 1 wherein one side of said polymeric film has said plasma treated surface, and said nickel tie coat layer and copper seed coat layer adhered to it; and the other side of said polymeric film has an adhesive layer adhered to it.

14. The laminate of claim 1 wherein one side of said polymeric film has said plasma treated surface, and said nickel tie coat layer and copper seed coat layer adhered to it; and the other side of said polymeric film has a metal foil adhered to it.

15. An adhesiveless flexible laminate, comprising:
   a flexible polyimide film having a thickness of up to about 5 mils and a plasma treated surface, the plasma used for treating said polymeric film comprising ionized oxygen generated by a non-metallic cathode;
   a nickel tie coat layer comprising nickel or a nickel alloy adhered to said plasma treated surface, said nickel tie coat layer having a thickness of about 30 to about 500 angstroms;
   a copper seed coat layer adhered to said nickel tie coat layer, said copper seed coat layer having a thickness of about 200 to about 20000 angstroms; and
   another layer of copper adhered to said copper seed coat layer, said another layer of copper having a thickness of up to about 70 µm.

16. A process for making an adhesiveless flexible laminate, comprising:
   (A) contacting at least one side of a polymeric film with a plasma comprising ionized oxygen produced from a non-metallizing cathode to provide a plasma treated surface;
   (B) depositing a tie coat layer of nickel or nickel alloy on said plasma treated surface; and
   (C) depositing a seed coat layer of copper on said nickel tie coat layer.

17. The process of claim 16 with the following additional step:
   (D) depositing another layer of copper over said copper seed coat layer from step (C).

18. The process of claim 16 wherein said polymeric film comprises at least one thermosetting resin, thermoplastic resin, polyester resin, polyimide resin, condensation polymer, or mixture of two or more thereof.

19. The process of claim 16 wherein said polymeric film comprises at least one polyester resin.

20. The process of claim 16 wherein said polymeric film comprises at least one polyimide resin.

21. The process of claim 16 wherein said polymeric film is flexible and has a thickness in the range of up to about 5 mils.

22. The process of claim 16 wherein the gas used in step (A) to produce said plasma comprises oxygen or air.

23. The process of claim 16 wherein the gas used in step (A) to produce said plasma comprises oxygen in combination with a gas selected from the group consisting of nitrogen, helium, argon, krypton, ammonia, nitrous oxide, carbon dioxide, carbon tetrafluoride, and mixtures of two or more thereof.

24. The process of claim 16 wherein said cathode used in step (A) is a carbon cathode.

25. The process of claim 16 wherein the pressure used during step (A) is in the range of about 20 mTorr to about 200 mTorr.

26. The process of claim 16 wherein during step (A) the discharge power density is in the range of about 0.1 to about 8 W/cm$^2$.

27. The process of claim 16 wherein during step (A) the total energy input into the surface of the polymeric film is in the range of about 0.02 to about 150 J/cm$^2$.

28. The process of claim 16 wherein a nickel alloy is used during step (B), the alloying metal being selected from the group consisting of Cu, Cr, Fe, V, Ti, Al, Si, Pd, Ta, W, Zn, In, Sn, Mn, Co or a mixture of two or more thereof.

29. The process of claim 16 wherein the thickness of said nickel tie coat deposited during step (B) is in the range of about 30 to 500 angstroms.

30. The process of claim 16 wherein said nickel tie coat layer deposited during step (B) is deposited using vapor deposition.

31. The process of claim 16 wherein said nickel tie coat deposited during step (B) is deposited using thermal evaporation, electron beam deposition, inductive deposition, resistive deposition, ion plating, sputtering, plasma activated evaporation, reactive evaporation, activated reactive evaporation or chemical vapor deposition.

32. The process of claim 16 wherein said nickel tie coat deposited during step (B) is deposited using sputtering.

33. The process of claim 16 wherein said copper seed coat deposited during step (C) is deposited using vapor deposition.

34. The process of claim 16 wherein said copper seed coat deposited during step (C) is deposited using thermal evaporation, electron beam deposition, inductive deposition, resistive deposition, ion plating, sputtering, plasma activated evaporation, reactive evaporation, activated reactive evaporation or chemical vapor deposition.

35. The process of claim 16 wherein said copper seed coat deposited during step (C) is deposited using sputtering.

36. The process of claim 16 wherein the copper seed coat layer deposited during step (C) has a thickness in the range of about 200 to about 20000 angstroms.

37. The process of claim 17 wherein said another layer of copper deposited during step (D) is deposited using electroplating.

38. The process of claim 17 wherein said another layer of copper deposited during step (D) has a thickness of up to about 70 microns.

39. A process for making an adhesiveless flexible laminate, comprising:
   contacting at least one side of a polyimide film with a plasma comprising ionized oxygen produced from a non-metallizing cathode to provide a plasma treated surface;
   depositing a tie coat of nickel or nickel alloy on said plasma treated surface;
   depositing a seed coat of copper on said nickel tie coat, said copper seed coat having a thickness in the range of about 200 to about 20000 angstroms; and
   depositing another layer of copper on said copper seed coat, said another layer of copper having a thickness of up to about 70 μm.

* * * * *